United States Patent
Moffat

(10) Patent No.: US 10,319,612 B2
(45) Date of Patent: Jun. 11, 2019

(54) METHOD FOR THE RAPID PROCESSING OF POLYMER LAYERS IN SUPPORT OF IMIDIZATION PROCESSES AND FAN OUT WAFER LEVEL PACKAGING INCLUDING EFFIECIENT DRYING OF PRECURSOR LAYERS

(71) Applicant: YIELD ENGINEERING SYSTEMS, INC., Livermore, CA (US)

(72) Inventor: William Moffat, San Jose, CA (US)

(73) Assignee: Yield Engineering Systems, Inc., Livermore, CA (US)

(*) Notice: Subject to any disclaimer, the term of this patent is extended or adjusted under 35 U.S.C. 154(b) by 0 days.

(21) Appl. No.: 16/174,260

(22) Filed: Oct. 29, 2018

(65) Prior Publication Data

US 2019/0109022 A1    Apr. 11, 2019

Related U.S. Application Data

(63) Continuation of application No. 15/206,318, filed on Jul. 11, 2016, now Pat. No. 10,147,617.

(60) Provisional application No. 62/303,391, filed on Mar. 4, 2016, provisional application No. 62/281,723, filed on Jan. 21, 2016.

(51) Int. Cl.
  *H01L 21/67* (2006.01)
  *B32B 27/28* (2006.01)

(52) U.S. Cl.
  CPC ...... *H01L 21/67034* (2013.01); *B32B 27/281* (2013.01); *B32B 2250/24* (2013.01); *B32B 2274/00* (2013.01)

(58) Field of Classification Search
  CPC .................................. H01L 21/67034
  See application file for complete search history.

(56) References Cited

U.S. PATENT DOCUMENTS 9,373,603 B2 * 6/2016 Ang ......................... H01L 24/75
2012/0187598 A1 * 7/2012 Lee ......................... B29C 43/18
                                                          264/272.15

* cited by examiner

*Primary Examiner* — Errol V Fernandes
(74) *Attorney, Agent, or Firm* — Michael A. Guth

(57) ABSTRACT

A process for the drying, and subsequent imidization, of polyimide precursors which minimizes or eliminates voids and which minimizes or eliminates discoloration. The process uses a sequential set of descending pressure operations that allow for time efficient processing of wafers. The set of descending pressure operations are interspersed with evacuation processes using heated gasses, which combine heating and byproduct evacuation. The process results in layers with reduced or eliminated voiding, discoloration, and solvent retention.

17 Claims, 9 Drawing Sheets

METHOD FOR THE RAPID PROCESSING OF POLYMER LAYERS IN SUPPORT OF IMIDIZATION PROCESSES AND FAN OUT WAFER LEVEL PACKAGING INCLUDING EFFIECIENT DRYING OF PRECURSOR LAYERS

CROSS-REFERENCE TO RELATED APPLICATIONS

This application is a continuation of U.S. patent application Ser. No. 15/206,318 to Moffat, filed Jul. 11, 2016, which claims priority to U.S. Provisional Patent Application No. 62/281,723 to Moffat, filed Jan. 21, 2016, and which claims priority to U.S. Provisional Patent Application No. 62/303,391 to Moffat, filed Mar. 4, 2016, all of which are hereby incorporated by reference in their entirety.

BACKGROUND

Field of the Invention

This invention relates to the coating of substrates, and in particular to a process for more effective and rapid drying of polymer layers.

Description of the Related Art

A continuing trend in semiconductor technology is the formation of integrated circuit (IC) chips having more and faster circuits thereon. Such ultralarge scale integration has resulted in a continued shrinkage of feature sizes with the result that a large number of devices are made available on a single chip. With a limited chip surface area, the interconnect density typically expands above the substrate in a multi-level arrangement and the devices have to be interconnected across these multiple levels. The interconnects must be electrically insulated from each other except where designed to make contact. Usually electrical insulation requires depositing dielectric films onto a surface, for example using a CVD or spinning-on process. The shrinkage in integrated circuit design rules has simultaneously reduced the wiring pitch. These have made the signal propagation delay in the interconnects an appreciable fraction of the total cycle time. The motivation to minimize signal delay has driven extensive studies to develop a low dielectric constant (low-k) material that can be used as an inter-level dielectric in integrated circuit (IC) manufacturing. The majority of low-k materials used in the ILD layer are based on thermally cured spin-on organic or inorganic polymers.

Polyimide is a polymer material often used in the production of semiconductor substrates such as silicon wafers. Polyimide is a desirable insulating material for semiconductor wafers because of its outstanding physical properties. Unfortunately, polyimide typically requires a long time to cure when conventional heating techniques are used. A cure cycle of several hours is typical and this often becomes the pacing step in semiconductor fabrication. In addition, there are other problems involved with curing polyimide resin with conventional heat. For example, when polyimide resin is cured in a conventional furnace, the outer surface of the resin typically cures faster than the center portions. This can cause various physical defects, such as the formation of voids, and can result in inferior mechanical properties such as reduced modulus, enhanced swelling, solvent uptake, and coefficient of thermal expansion.

A polyimide precursor may be applied to a substrate, and then dried to prepare for imidization of the polymer. A goal of the drying process is to remove the solvent from the polymer (which may be N-Methyl-2-pyrrolidone, NMP, for example), and it can also be important to remove oxygen during the drying process. In addition, further goals of the drying process are to minimize or eliminate any bubbles/voids in the polymer layer, to minimize discoloration to the layer that may be induced by heating, and to fully remove residual solvent from the precursor mix. Each of these items sought to be eliminated may interfere with subsequent process steps, or enhance the probability of failure of a device containing the polyimide layer.

In addition to need to dry polyimide precursor layer, some semiconductor manufacturing processes present the need to outgas plastic mold compounds. For example, in Fan Out Wafer Level Processing (FOWLP), the plastic molding compounded which the semiconductor die are molded into may require outgassing to remove compounds that will interfere with subsequent processing, such as metallization steps.

What is called for is a process which can quickly dry a polymer compound, which may be a polyimide precursor. What is further called for is such a process that minimizes or eliminates void, discoloration, and that also results in thorough solvent removal. What is also called for is a process which can both quickly dry a polyimide precursor and outgas plastic molding in a single step, greatly reducing processing time.

SUMMARY

A process for the drying, and subsequent imidization, of polyimide precursors which minimizes or eliminates voids and which minimizes or eliminates discoloration. The process uses a sequential set of descending pressure operations that allow for time efficient processing of wafers. The set of descending pressure operations are interspersed with evacuation processes using heated gasses, which combine heating and byproduct evacuation. The process results in layers with reduced or eliminated voiding, discoloration, and solvent retention. The process may also be used during Fan Out Wafer Lever Processing fabrication steps to outgas plastic molding compounds, which may be outgassed simultaneously during the polyimide precursor drying steps.

DETAILED DESCRIPTION

Figure 1:
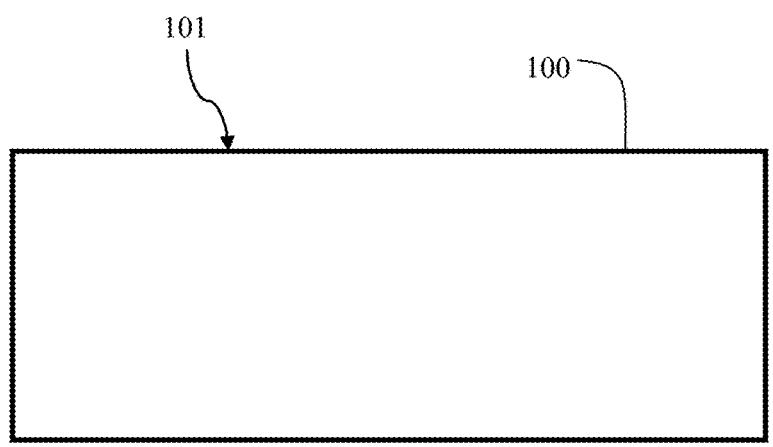
FIG. 1 is an illustrative view of a substrate.

A method for the drying of a polyimide precursor such as a layer on a silicon substrate. The method may be significantly quicker than prior drying methods, while also resulting in polyimide layers with fewer or no defects. In some prior processes, the drying is incomplete as the layer is not sufficiently dried as the higher temperature imidization process is transitioned into, resulting in bubbling within the layer. The bubbles are voids which can result in faults that cause failures in the end product, such as microchips, for example. In some devices, multiple layers of polyimide may be used, with the possibility of failure compounded with each additional layer.

In some prior processes, the polyimide precursor layer may become discolored due to exposure of the layer to oxygen at temperature. The layer may become brown, which will significantly interfere with the transmission of light through the cured polyimide layer. The layers may need to retain their clarity to allow for retention of sight of lower level alignment features or marks. In some aspects the polyimide layer may also be a photosensitive layer, and browning of the layer may interfere with the exposure of the layer. In embodiments of the present invention, the drying steps of the process not only result in a dried polyimide precursor layer with the advantages as listed above and described herein, but also result in the process oven having a very extremely low oxygen level, allowing for further processing of the substrates in that same process oven in an extremely low oxygen level environment.

In some aspects, semiconductor die are molded into a plastic molding compound in support of Fan Out Wafer Level Packaging (FOWLP) fabrication. After the molding, a number of subsequent process steps may occur. Subsequent metallization steps may need to be done at very low pressures, and outgassing of the plastic molding compound interferes with this metallization step, by extending the time it takes to get to the reduced metallization pressure (vacuum level). Typically there may be a polyimide layer over the plastic molding compound, which is put in place prior to a metallization step. In some prior processes, an outgassing step for the plastic molding compound was needed, as well as a drying step for the polyimide precursor prior to imidization. In some embodiments of the present invention, a single process may be used to both outgas the plastic molding compound and to dry the polyimide precursor layer. As discussed below, polyimide precursor drying according to embodiments of the present invention provides the unusual, and significantly improved, circumstance of greatly reducing processing time while also significantly reducing defect levels in the polyimide layer after imidization, resulting in a higher overall throughput in a shorter time. Coupled with plastic molding compound outgassing during the later FOWLP steps, embodiments of the present invention may replace two longer process steps with a single shorter step (shorter than either of the previously required two steps).

Figure 2:
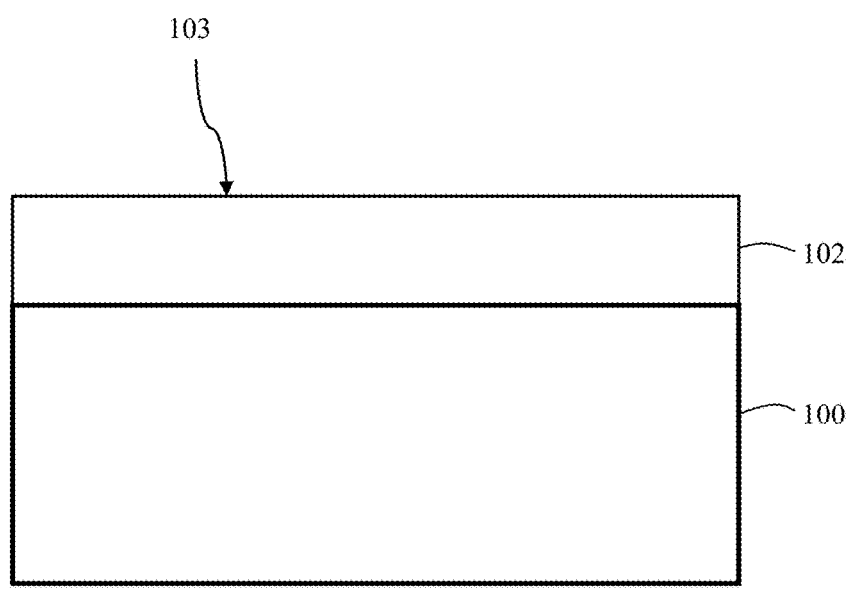
FIG. 2 is an illustrative view of a substrate with a polyimide precursor layer.

In an exemplary embodiment, a substrate is ready for further processing. In some aspects, the substrate may be a silicon wafer, which may have been doped or otherwise processed. FIG. 1 illustrates a substrate with a top surface 101. The substrate 100 may be a silicon substrate. The substrate may be a circular silicon substrate of up to 14 inches in diameter. FIG. 2 illustrates a substrate 100 with a polyimide precursor layer 102. The polyimide precursor 102 has a top surface 103. A liquid polyimide precursor is applied over a substrate, or over prior layers already applied over a substrate. The polyimide precursor may have a solvent such as NMP.

Figure 3:
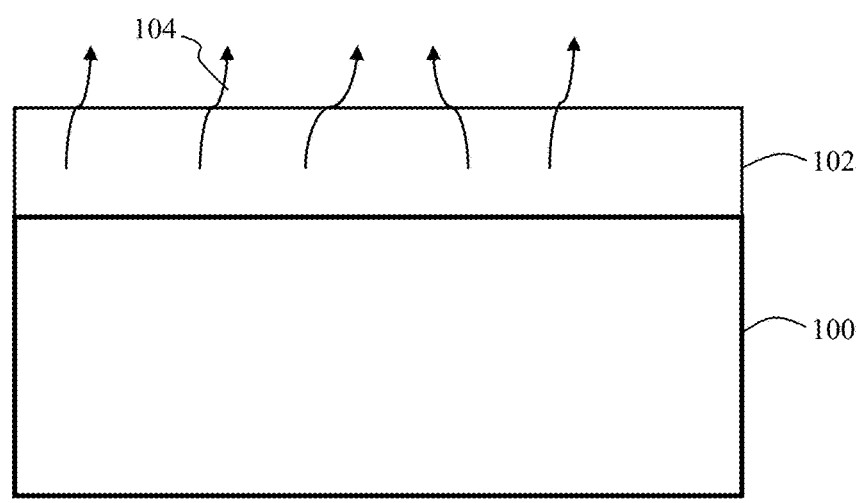
FIG. 3 is an illustrative view of a substrate with a polyimide precursor layer.
Figure 4:
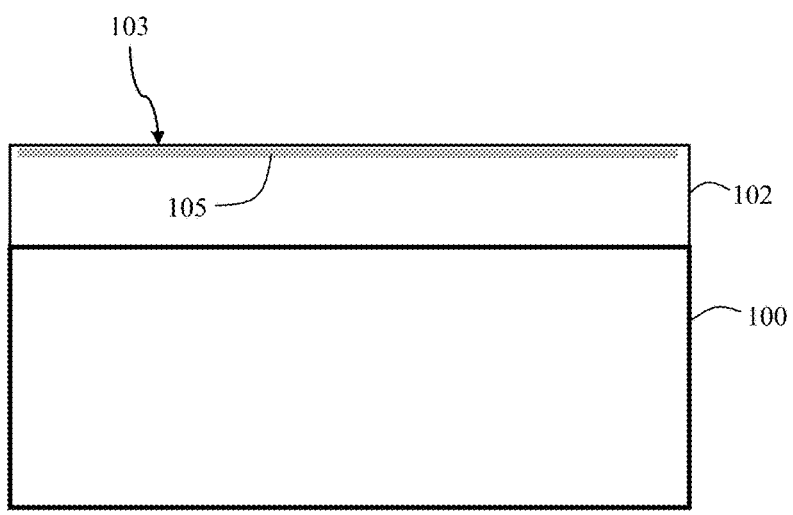
FIG. 4 is an illustrative view of a substrate with a polyimide precursor layer.

In some aspects, a drying process is implemented to completely or nearly completely dry the precursor layer prior to going to a higher temperature for imidization, as with temperature imidization processes. FIG. 3 illustrates a substrate with a polyimide precursor layer 102. With a drying process, the solvent is liberated 104 from the polyimide precursor layer. At room temperature, NMP boils at approximately 205 C. A drawback with raising the polyimide precursor layer to the NMP boiling temperature is that the polyimide precursor layer may begin to skin over at 200 C. FIG. 4 illustrates a substrate 100 with a polyimide precursor layer 102. In this illustrative example of a non-favored result, a skinning layer 105 has formed along the top surface 103 of the polyimide precursor layer 102. A skinning layer 105 may interfere with the liberation of evaporating solvent from the polyimide precursor layer 102.

Figure 5:
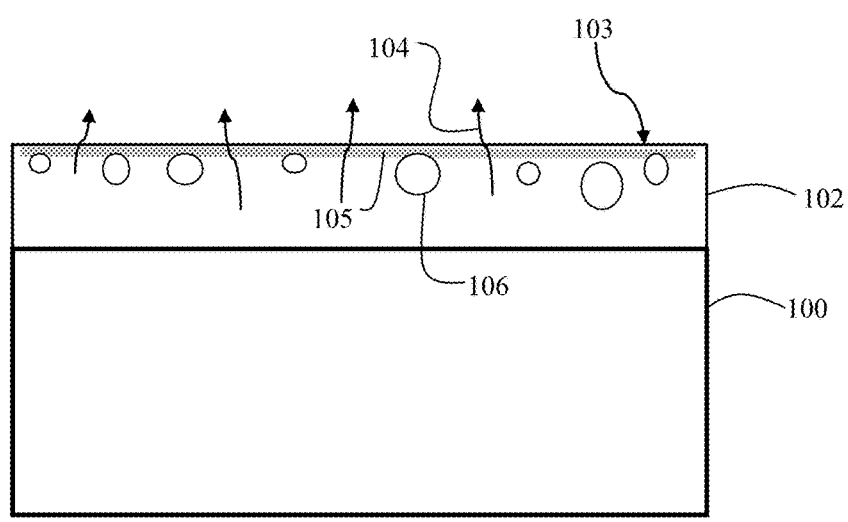
FIG. 5 is an illustrative view of a substrate with a polyimide precursor layer.

The skinning over of the polyimide precursor layer may trap the evaporating solvent within the polyimide precursor layer, interfering with liberation of gas from the layer as the solvent evaporates. Retained solvent may then result in large bubbles in the imidized layer as the volume of the solvent as a gas at the higher imidization temperatures increases, and then is made permanent as the polyimide layer becomes hard via imidization. FIG. 5 illustrates a non-favored condition wherein bubbles 106 have formed within the polyimide precursor layer 102, and are being prevented from being liberated 104 from the polyimide precursor layer by the skinning layer 105.

Figure 6:
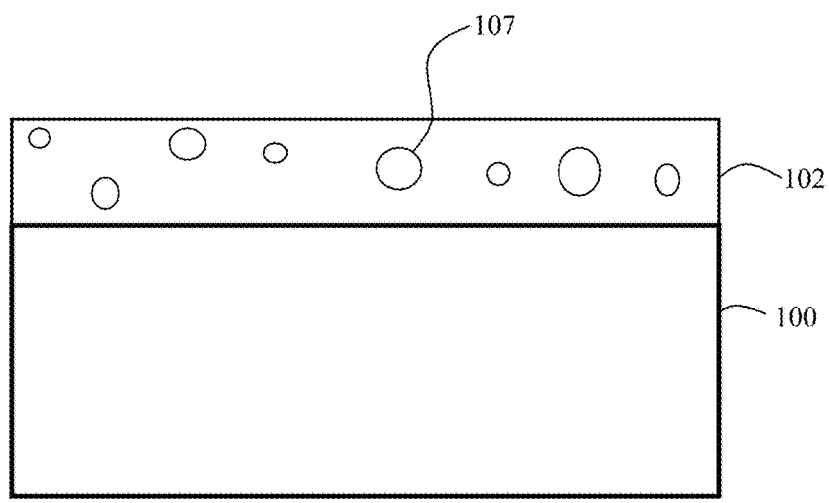
FIG. 6 is an illustrative view of a substrate with a polyimide precursor layer.

FIG. 6 illustrates another non-favored condition wherein large bubbles 107 are forming within the polyimide precursor layer 102. In some prior processes, driving the drying process with too low of a pressure to soon, as opposed to stepped drying pressures according to some embodiments of the present invention, may result in large bubble formation. Also, in cases where the polyimide precursor is not fully dried prior to the raising of temperature to imidization temperature, bubbles may form during this temperature rise as residual solvent evaporates but is trapped in the already hardening polyimide precursor layer as imidization is occurring. The resultant bubbles 107 reduce the reliability of the polyimide layer, and may result in faults in the completed semiconductor.

Figure 7:
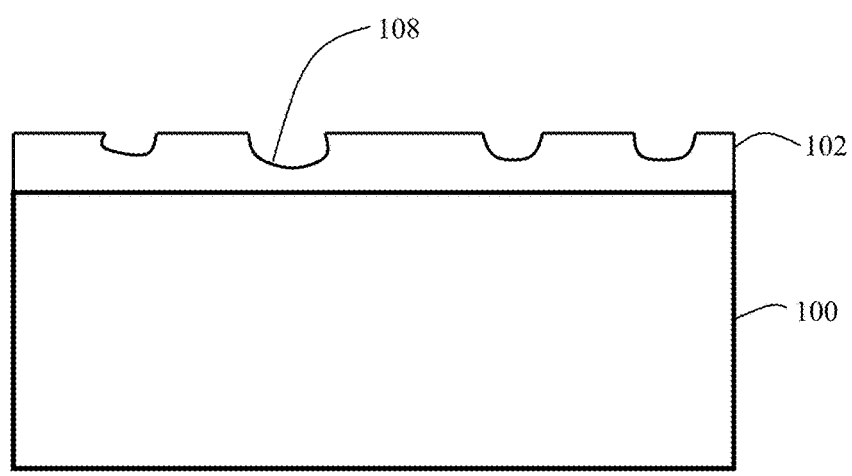
FIG. 7 is an illustrative view of a substrate with a polyimide precursor layer.

Large bubbles may also travel to the surface of the drying polyimide precursor resulting in polyimide popping, leaving craters in the surface. FIG. 7 illustrates popped bubbles 108 in a polyimide layer 102 on a substrate 100. The bubbles are then voids in a needed protective, insulating, layer which may result in faults in the final product semiconductor, using one example.

In some embodiments of the present invention, the drying process is carried out in a process chamber with low pressure/vacuum capabilities. The process chamber may also include capability for inletting heated inert gas, such as nitrogen. The process chamber may also be able to be heated for supporting the drying process. The process chamber may also be able to be heated to even higher temperatures to support temperature imidization processing after the drying portion of the process.

With reduced pressure, the solvent will boil at a lower temperature. For example, NMP boils at approximately 105 C at 50 Torr. Using an example of a substrate coated with a polyimide precursor, or a plurality of such coated substrates, the substrates are delivered into a process chamber. The process chamber may be heated to a temperature below the room temperature boiling point of the solvent. The solvent may be NMP and the initial heating temperature may be 150 C. The pressure used is subject to at least two conflicting constraints. On the one hand, the pressure should be reduced enough to evaporate the solvent, allowing for the low pressure liberation of the gas which permeates the liquid/gel precursor and is liberated to the low pressure chamber. On the other hand, too much evaporation, too quickly, could lead to aggregation of the gas into bubbles, which may lead to popping on the surface or other issues. Further, though, lowering the chamber pressure in further steps to a pressure even lower than 50 Torr creates more pressure differential between the bottom of the gel, against the substrate, and the low pressure chamber, better driving out the gas. These goals and risks are what are now addressed below.

Figure 8:
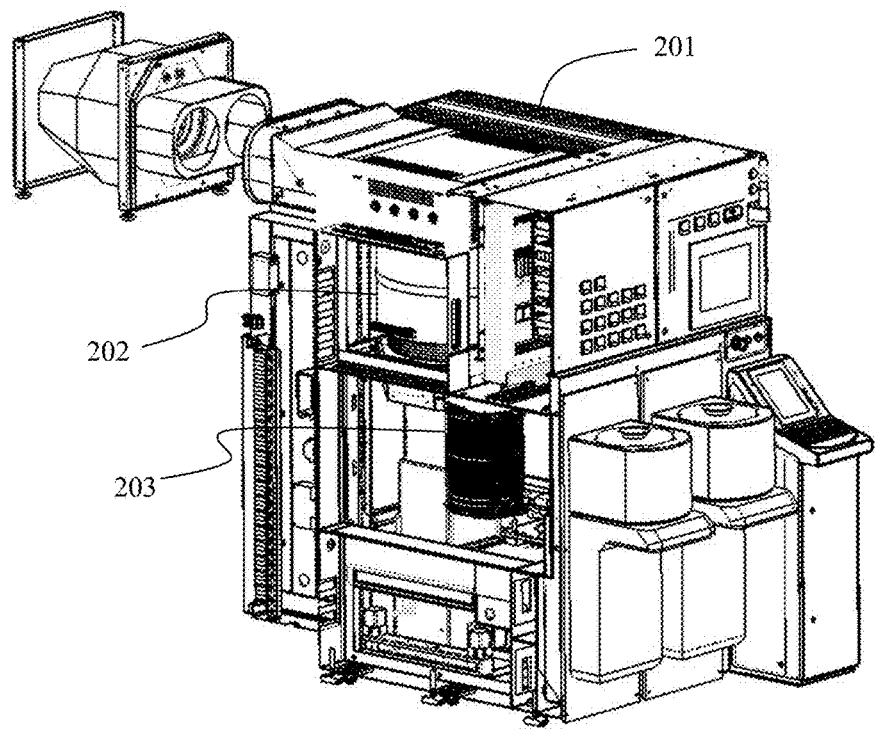
FIG. 8 is an illustrative view of a process oven which may be used in processes according to embodiments of the present invention.

In an exemplary process according to some embodiments of the present invention, a polyimide precursor is applied to a silicon substrate. In some aspects, the polyimide precursor is applied directly over the silicon substrate. In some aspects, the polyimide precursor is applied over other layers already on a substrate, which may be other polyimide layers and metal layers, for example. In some aspects, the solvent used in the polyimide precursor is NMP. An expected thickness for semiconductor applications is in the range of 7-10 microns. Although a single substrate could be processed, in some aspects a plurality of substrates may be processed. As seen in FIG. 8, a process oven 201 may be used to support a plurality of substrates 203 within a chamber 202. The process oven may include internal heaters, heated inert gas inputs, and vacuum capability. The substrates are placed into the chamber 202 that has been heated to 150 C. In some aspects, the chamber is heated to a temperature in the range of 135 C to 180 C. The chamber pressure is reduced to a first drying pressure of 50 Torr. In some embodiments, the first drying pressure is in the range of 30-60 Torr. After reaching the first drying pressure, the chamber may then be flushed with a heated inert gas such as nitrogen at a pressure of 600 Torr. In some aspects the heated inert gas may be at a pressure in the range of 550 to 760 Torr. The nitrogen may be heated to the same temperature as the chamber, 150 C. The chamber pressure is then reduced to a second drying pressure of 25 Torr. In some embodiments, the second drying pressure is in the range of 15-30 Torr. After reaching the second drying pressure, the chamber may then be flushed with a heated inert gas such as nitrogen at a pressure of 600 Torr. In some aspects the heated inert gas may be at a pressure in the range of 550 to 760 Torr. The nitrogen may be heated to the same temperature as the chamber, 150 C. The chamber pressure is then reduced to a third drying temperature of 1 Torr. In some embodiments, the third drying pressure is in the range of 1-15 Torr. After reaching the third drying pressure, the chamber may then be filled with heated inert gas, such as nitrogen, up to 650 Torr, in preparation for imidization of the polyimide precursor. The substrates may then undergo temperature imidization in the same chamber. As described further below, the oxygen level in the process oven may now be very extremely low. The subsequent temperature imidization may occur at 350-375 C, and as further described below.

In an exemplary embodiment further illustrating the timing of a process as described above, a process may begin with the heating of the process oven to a temperature of 150 C. A single substrate or a plurality of substrates within the process oven, which include a polyimide precursor including a solvent such as NMP, are put into the process oven which has been preheated to the temperature of 150 C. The process oven pressure is then reduced to a first drying pressure of 50 Torr. This portion of the process may take 2-3 minutes. The process oven is then flushed with preheated nitrogen heated to 150 C up to a pressure of 600 Torr. This portion of the process may take 2-3 minutes. The process oven pressure is then reduced to a second drying pressure of 25 Torr. This portion of the process may take 3-4 minutes. The process oven is then flushed with preheated nitrogen heated to 150 C up to a pressure of 600 Torr. This portion of the process may take 2-3 minutes. The process oven pressure is then reduced to a third drying pressure of 1 Torr. This portion of the process may take 4-5 minutes. The process oven is then flushed with preheated nitrogen heated to 150 C up to a pressure of 650 Torr. This portion of the process may take 2-3 minutes. The aforementioned steps have now greatly reduced the oxygen level in the process oven, as well as having removed all or nearly all of the solvent from the polyimide precursor with little or no bubbling or skinning of the polyimide precursor. The aforementioned steps combine the above mentioned advantages of reduced oxygen levels in the process oven and a precursor layer with little or no bubbling or skinning, while being performed more quickly than other currently used processes. The other currently used processes not only take longer, but they also result in polyimide precursor layers which have bubbling, skinning, popping, or other detrimental attributes, and further, do not have the sought after very low oxygen level.

After the multi-step drying process, the substrates are now ready for temperature imidization. As discussed further below, the oxygen level in the process oven may now be down as low as approximately 1 ppm, as an end result of the drying process. An exemplary temperature imidization process may now include maintaining approximately 250 Torr in the process chamber while inputting heated nitrogen at the top of the process oven while pulling vacuum at the bottom of the process oven. The heated nitrogen and the oven temperatures may now be raised in unison, for example, to 350 C. At 4 C/minute, this heating process would take 50 minutes. At 350 C the oven and gas temperatures may be held for 1 hour for temperature imidization of the polyimide precursor. Although 350 C is an illustrative temperature using NMP, other temperatures may used for the temperature imidization. After the temperature imidization, the oven heaters may be turned off, which will result in a cooling of the oven. The heated nitrogen flow may be cooled at a rate which tracks the cooling oven.

The vacuum pulsing as described above, in conjunction with the intervening flushing with nitrogen, provides another important benefit for the imidization process, which is already separately enhanced by the significantly enhanced drying. The vacuum pulsing and intervening flushing results in a much lower oxygen level in the process chamber as the substrates go further in the process. In contrast to prior methods which pull vacuum once for a combined drying/imidization process, the vacuum pulsing reduces the partial pressure of oxygen significantly, as each flushing with nitrogen resets the initial gas balance prior to the next pull of vacuum. The inflows of heated inert gas enhance the heating of the polyimide precursor layer, as well as the fixturing within the chamber and the chamber itself. The reduced pressure of the process described herein enhances, and speeds up, the evaporation of the solvent, and also allows for a temperature to be used for the evaporation that is below the skinning temperature of the polyimide precursor. The staging of the reduced pressure at sequentially lower pressures reduces bubbling which might occur by simply going straight to a very reduced pressure, and avoids the residual solvent which would remain if the very reduced pressure is not utilized. Residual solvent may inhibit the imidization of the polyimide precursor. The pulsing and flushing then further adds the benefit of a final chamber composition with significantly less oxygen than prior methods, reducing or eliminating the browning which may occur in the polyimide layer during temperature imidization in the presence of oxygen.

With the tiered vacuum application, in conjunction with nitrogen flushing, oxygen levels may be driven very, very low. With the above-described process, the starting concentration of oxygen at the initial atmospheric conditions is approximately 230,000 parts per million (ppm). When the initial vacuum is applied down to 50 Torr, and then the chamber is refilled with nitrogen, the concentration of oxygen will have been reduced to approximately 15, 131 ppm. With the subsequent vacuum pull down to 25 Torr, and then refilling with nitrogen, the concentration of oxygen will have been reduced to approximately 498 ppm. With the final vacuum pull down to 1 Torr, and subsequent refilling with nitrogen, the resulting concentration of oxygen will be down to 0.65 ppm. The very, very, low oxygen concentrations that result allow for a subsequent processing, including temperature imidization, at oxygen concentrations well below any prior process. In actual practice, the purity of the nitrogen supply may become the active parameter in how low of an oxygen concentration can be reached. If the nitrogen supply is known to have 10 ppm oxygen, for example, then that will limit the depth of oxygen removal. Some processing chambers may have nitrogen availability with down to 1 ppm $O_2$, and with such a system oxygen concentration can be driven down to approximately 1 ppm. Simple flushing of a chamber with pure nitrogen provides some reduction in oxygen concentration, but such processes are very time consuming and do not achieve results at all comparable to the above-described process.

Further, the use of heated nitrogen for the re-filling steps in the above-described process works to minimize the effects of freezing than may have happened during the vacuum pull. As water boils at 72 C at 50 Torr, 26 C at 25 Torr, and −21 C at 1 Torr, the heated nitrogen input thus facilitated evaporation of any water than may be found in the devices being dried or outgassed.

In addition to the reduction or elimination of browning, and the reduction or elimination of bubbling and popping in the polyimide precursor layer, the process as described herein adds another significant improvement that in spite of the much higher quality polyimide layer that results, the process is much quicker than prior processes. Using a process according to embodiments of this invention, a substrate, or a plurality of substrates, may be dried and temperature imidized in 3-3.5 hrs, whereas typically current processes may take up to 12 hours to dry and imidize a polyimide layer. With the increasing number of layers in modern semiconductor devices, which may include up to 17 polyimide layers, for example, the time and thus cost savings can be extremely significant.

In some embodiments, the temperature of the oven during drying is 150 C. In some embodiments, the temperature of the oven is in the range of 135-180 C. In some embodiments, the first drying pressure is 50 Torr. In some embodiments, the first drying pressure is in the range of 30-60 Torr. In some embodiments, the second drying pressure is 25 Torr. In some embodiments, the second drying pressure is in the range of 15-30 Torr. In some embodiments, the third drying pressure is 1 Torr. In some embodiments, the third drying pressure is in the range of 1-15 Torr.

In a further embodiment of the present invention, the process used to dry the polyimide precursor prior to temperature imidization may also be used to outgass plastic molding compound which may surround a semiconductor die in FOWLP fabrications. Initially, the rapid drying process of polyimide precursor layers may be done to support processing steps on the entire wafer. Each of the rapid drying steps may both reduce the time of the drying step relative to prior processes, and also increase reliability of the processed items. With each polyimide layer on the wafer buildup, processes according embodiments of the present invention present at least the advantages of reduced processing time, enhanced quality of the polyimide layers, and reduces oxygen levels after the drying step.

Figure 9:
FIG. 9 is an illustrative view of die reconfigures for FOWLP processing.
Figure 10:
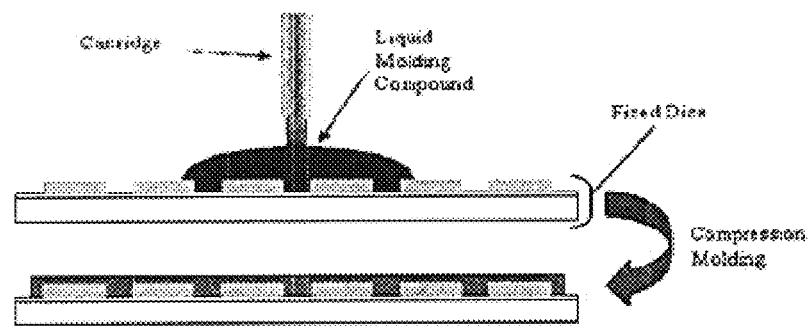
FIG. 10 is an illustrative view of the molding of die.
Figure 11:
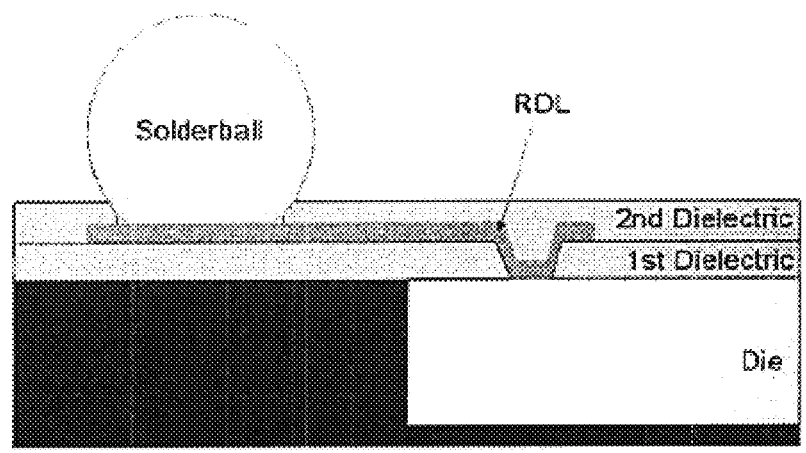
FIG. 11 is an illustrative side section of a FOWLP configuration.

Once the wafer is completed, the wafer may be sliced up into individual die. As seen in FIG. 9, the die may be reconfigured to allow for subsequent molding steps. In some aspects, these die are then partially surrounded by a plastic molding compound, which may allow for fan out configurations. FIG. 10 illustrates an exemplary molding process. This post wafer, die level, processing may include adding polyimide layers, especially to allow for metallization of leads supporting the fan out configuration. FIG. 11 illustrates an exemplary completed fan out wafer level packaging configuration in cross-section.

The plastic molding compound must be outgassed prior to the metallization process, and this step takes significant time. Further, the polyimide precursor layers should be dried prior to the temperature imidization process. In some embodiments of the present invention, a single process may be used to both outgas the plastic molding compound and to dry the polyimide precursor layer, as opposed to different processes of prior methods. Using the above-described polyimide precursor drying method will also outgas the plastic molding compound.

In an exemplary embodiment, plastic molding compound is molded around a die. A polyimide precursor layer is applied over a surface which may comprise both the molding compound and the die. Prior to imidization of the polyimide precursor layer, the assembly is dried according to drying processes of the present invention, as described above. This quick process will both outgas the plastic molding compound, and dry the polyimide precursor layer, substituting one process for what had previously been two processes, and which may be of significantly shorter duration.

The applicant builds cure ovens that are specifically designed to address the concerns of manufacturers of the cured characteristics of the multiple polyimide layers incorporated in Wafer-level Packaging (WLP)/Redistribution Layers (RDL) circuits. Polyimides are high temperature engineering polymers with excellent mechanical, thermal and electrical properties. The most important step of the process is the curing of the polyimide precursors, which can be done under atmospheric or vacuum process conditions. As discussed above, the objectives of a proper cure process are to complete the imidization process, optimize film adhesion performance, remove all residual solvents and extraneous gases, and remove photosensitive components.

To convert the polyimide precursors to a stable polyimide film, an elevated temperature (~250 C to 450 C) extended bake is required for complete imidization; it also drives off the N-methylpyrrolidone (NMP) casting solvents and orients the polymer chains for optimal electrical and mechanical properties.

The imidization rate of the polyimide precursors need to be controlled to take into account the differences in thermal expansion coefficient between the polyimide film and the underlying substrate. If the imidization rate is not controlled properly, there can be localized mechanical stress variations across the wafer. In addition, if the casting solvents evolve non-uniformly across the wafer, film thickness non-uniformity can occur due to uneven imidization. The mechanical stress variations can be observed as wrinkled polyimide film or as distorted metal lines in the structures under the polyimide layer. The polyimide film can also delaminate because film adhesion performance has not been optimized. Because mechanical stress variations can affect the yield and reliability of the process, it is critical that controlled temperature ramp rates are used to provide a larger process window for the proper curing of a polyimide film.

Non-uniform heating can cause a skin to form on the surface of the polyimide film during the curing process. The skin can prevent the efficient evolution of the casting solvents and other volatile gases. If a cured polyimide film still has residual solvents or other volatile gases, then localized areas of the polyimide film can rupture in a phenomenon known as "popcorning". These ruptures occur in subsequent process steps in tools, which have either a high vacuum or a high temperature environment. This rupturing is due to the sudden release of gas bubbles/solvents trapped in the polyimide film that is not properly cured. In addition, a "solvent-free" polyimide film will minimize the queue time needed to allow for outgassing when the next process step is a high vacuum process, such as metallization.

Photosensitive polyimides offer the advantage of simpler processing by eliminating the need for photoresist compared to standard non-photosensitive polyimides. This reduces the number of process steps. The curing process parameters, such as temperature, vary with the type of photosensitive precursors in the polyimide film. For some types of precursors, the photosensitive components can be difficult to evolve from the polyimide film. Residual photosensitive polyimide precursors can cause greater internal film-induced stress than those in a standard polyimide film.

Some photosensitive polyimide precursors and their byproducts also have a tendency to form depositions on the process chamber walls. Heavy deposits can be difficult to remove if the byproducts are not efficiently removed from the chamber during the curing process. Furthermore, when these byproducts are exhausted from the chamber, they also need to be substantially removed from the exhaust stream as the byproducts can redeposit along the exhaust lines. In summary, the photosensitive components must be eliminated from the polyimide film and efficiently removed from the process chamber.

The presence of oxygen in the process chamber inhibits the proper crosslinking of the polyimide precursors to polyimide thin film. The result is incomplete imidization which leads to a brittle film and variable stress in the polyimide film on the substrate. Also, ambient oxygen darkens the polyimide film. This film transparency is critical when multiple polyimide layers are used during subsequent processing. For multi-layer processes, the alignment marks for the process sequence can be obscured by the layers of low transparency polyimide films. In summary, pure nitrogen ambient is required to reduce the level of oxygen in the process chamber.

As described above, embodiments of the present invention allow for more complete drying of polyimide precursor layers, more quickly, and with fewer defects, while also offering the additional advantage of the resulting dried substrates/layers residing in an extremely low oxygen level environment. The subsequent temperature imidization is then further enhanced in quality. In the case of wafer die with polyimide precursor layers and molding compound, the outgassing of the molding compound may occurs simultaneously with the polyimide precursor drying, further reducing the time needed for such a process, and with higher throughput.

As evident from the above description, a wide variety of embodiments may be configured from the description given herein and additional advantages and modifications will readily occur to those skilled in the art. The invention in its broader aspects is, therefore, not limited to the specific details, representative apparatus and illustrative examples shown and described. Accordingly, departures from such details may be made without departing from the spirit or scope of the applicant's general invention.

I claim:

1. A process for drying of substrates in support of temperature imidization of polymer layers, said process comprising the steps of:
   inserting one or more substrates into a process chamber, said one or more substrates coated with a layer of polyimide precursor, said polyimide precursor comprising N-Methyl-2-pyrrolidone;
   reducing the pressure in said process chamber to a first drying pressure;
   first flushing said process chamber with inert gas to a first flushing pressure;
   reducing the pressure in said process chamber to a second drying pressure after said first flushing, wherein said second drying pressure is lower than said first drying pressure;
   second flushing said process chamber with inert gas to a second flushing pressure after the step of reducing the pressure in said process chamber to a second drying pressure;
   reducing the pressure in said process chamber to a third drying pressure after the step of second flushing said process chamber, wherein said third drying pressure is lower than said second drying pressure; and
   third flushing said process chamber with inert gas to a third flushing pressure after the step of reducing the pressure in said process chamber to a third drying pressure.

2. The process of claim 1 wherein said process chamber is heated to a first chamber temperature.

3. The process of claim 2 wherein said first flushing said process chamber with inert gas comprises flushing with inert gas heated to a first gas temperature.

4. The process of claim 3 wherein said second flushing said process chamber with inert gas comprises flushing with inert gas heated to a second gas temperature.

5. The process of claim 4 wherein said third flushing said process chamber with inert gas comprises flushing with inert gas heated to a third gas temperature.

6. The process of claim 5 wherein said first chamber temperature is in the range of 135 C to 180 C.

7. The process of claim 6 wherein said first drying pressure is in the range of 30-60 Torr.

8. The process of claim 6 wherein said first drying pressure is in the range of 30-50 Torr.

9. The process of claim 8 wherein said second drying pressure is in the range of 15-30 Torr.

10. The process of claim 9 wherein said third drying pressure is in the range of 1-15 Torr.

11. The process of claim 1 wherein said first gas temperature is in the range of 135 C-180 C.

12. The process of claim 11 wherein said first gas temperature is in the range of 135 C-180 C.

13. The process of claim 11 wherein said second gas temperature is in the range of 135 C-180 C.

14. The process of claim 12 wherein said second gas temperature is in the range of 135 C-180 C.

15. The process of claim 13 wherein said second gas temperature is in the range of 135 C-180 C.

16. The process of claim 14 wherein said second gas temperature is in the range of 135 C-180 C.

17. The process of claim 16 further comprising the step of temperature imidizing a polymer layer on said one or more substrates after the step of third flushing said process chamber while having maintained the low oxygen level of the drying steps.

* * * * *